US005753408A

United States Patent [19]
Van Rompuy et al.

[11] Patent Number: 5,753,408
[45] Date of Patent: May 19, 1998

[54] METHOD FOR MAKING AN OFFSET PRINTING PLATE ACCORDING TO THE SILVER SALT DIFFUSION TRANSFER PROCESS

[75] Inventors: Ludo Van Rompuy, Mortsel; Paul Coppens, Turnhout, both of Belgium

[73] Assignee: AGFA-GEVAERT, N.V., Mortsel, Belgium

[21] Appl. No.: 787,693

[22] Filed: Jan. 27, 1997

Related U.S. Application Data

[60] Provisional application No. 60/014,877 Apr. 4, 1996.

[30]  Foreign Application Priority Data

Feb. 14, 1996 [EP]  European Pat. Off. ............. 96200365

[51] Int. Cl.$^6$ ................................. G03C 8/36; G03F 7/07
[52] U.S. Cl. .................. 430/204; 430/249; 430/436; 430/440; 430/480
[58] Field of Search ...................... 430/204, 249, 430/440, 436, 480

[56]  References Cited

U.S. PATENT DOCUMENTS

| | | | |
|---|---|---|---|
| 3,870,479 | 3/1975 | Kubotera et al. | 430/204 |
| 5,399,457 | 3/1995 | Davies et al. | 430/249 |
| 5,607,811 | 3/1997 | Vaes et al. | 430/204 |

*Primary Examiner*—Richard L. Schilling
*Attorney, Agent, or Firm*—Breiner & Breiner

[57]  ABSTRACT

The present invention provides a method for making an offset printing plate according to the silver salt diffusion transfer process comprising the steps of:

image-wise exposing an imaging element comprising in the order given on a hydrophilic surface of a support (i) an image receiving layer containing physical development nuclei and (ii) a photosensitive layer comprising one or more photosensitive silver halide emulsions said photosensitive layer being in water permeable relationship with said image receiving layer, applying an aqueous alkaline solution to the imaging element comprising at least 0.05 mole/l of ascorbic acid as the main developer, at least 0.010 mole/l of an auxiliary developer of the class of the 1-phenyl-3-pyrazolidones and an aminoalcohol in an amount from 0.1 ml to 10 ml as silver halide solvent to form a silver image in said image receiving layer, treating the imaging element to remove the layer(s) on top of the image receiving layer, thereby exposing the imaged surface of the support by uncovering said silver image formed in said image receiving layer, characterized in that said aqueous alkaline solution contains sodium ions but no potassium ions or sodium and potassium ions in which case the molar ratio of sodium ions to potassium ions in said aqueous alkaline solution is at least 3:1.

10 Claims, No Drawings

METHOD FOR MAKING AN OFFSET PRINTING PLATE ACCORDING TO THE SILVER SALT DIFFUSION TRANSFER PROCESS

DESCRIPTION

Benefit is claimed from Provisional application 60/014,899 filed Apr. 4, 1996 under 35 usc 119.

Field of the Invention

The present invention relates to a method for making improved lithographic printing plates according to the silver salt diffusion transfer process.

Background of the Invention.

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York. (1972).

In the DTR-process non-developed silver halide of an information-wise exposed photographic silver halide emulsion layer material is transformed with a so-called silver halide solvent into soluble silver complex compounds which are allowed to diffuse into an image receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellent ink-receptive areas on a water-receptive ink-repellent background.

The DTR-image can be formed in the image receiving layer of a sheet or web material which is a separate element with respect to the photographic silver halide emulsion material (a so-called two-sheet DTR element) or in the image receiving layer of a so-called single-support-element, also called mono-sheet element, which contains at least one photographic silver halide emulsion layer integral with an image receiving layer in waterpermeable relationship therewith. It is the latter mono-sheet version which is preferred for the preparation of offset printing plates by the DTR method.

Two types of the mono-sheet DTR offset printing plate exist. According to a first type disclosed in e.g. U.S. Pat. No. 4,722,535 and GB-1,241,661 a support is provided in the order given with a silver halide emulsion layer and a layer containing physical development nuclei serving as the image-receiving layer. After information-wise exposure and development the imaged element is used as a printing plate without the removal of the emulsion layer.

According to a second type of mono-sheet DTR offset printing plate a hydrophilic support, mostly anodized aluminum, is provided in the order given with a layer of physical development nuclei and a silver halide emulsion layer. After information-wise exposure and development the imaged element is treated to remove the emulsion layer so that a support carrying a silver image is left wich is used as a printing plate. Such type of lithographic printing plate is disclosed e.g. in U.S. Pat. No. 3,511,656.

As for other printing plates it is required that the offset printing plates belonging to the second type of mono-sheet DTR offset printing plates have good printing properties: a high printing endurance, good ink acceptance in the printing areas and no ink acceptance in the non-printing areas (no toning). An appropriate sensitometry, particularly a high gradient of the printing plate is therefore required.

Furthermore the processing of the exposed imaging element in order to obtain a printing plate comprises the step of developing said exposed imaging element using an alkaline processing liquid in the presence of developing agent(s) and silver halide solvent(s). Nowadays hydroquinone or a derivative thereof are used as developing agent. These compounds are from an ecological viewpoint not interesting. So the use of other more ecologically friendly developing agents is desirable. Ascorbic acid is such an ecologically friendly developer but the results when using ascorbic acid as the main developer in the processing of a lithographic printing plate precursor according to the silver salt diffusion were unsatisfactory.

SUMMARY OF THE INVENTION

It is an object of the present invention to provide a method for making a lithographic printing plate according to the DTR-process with an improved sensitometry, particularly a high gradient of the printing plate.

It is a further object of the present invention to provide a method for making a lithographic printing plate according to the DTR-process comprising the use of a developing solution containing ascorbic acid as the main developer.

Still further objects of the present invention will become clear from the description hereinafter.

According to the present invention there is provided a method for making an offset printing plate according to the silver salt diffusion transfer process comprising the steps of:

image-wise exposing an imaging element comprising in the order given on a hydrophilic surface of a support (i) an image receiving layer containing physical development nuclei and (ii) a photosensitive layer comprising one or more photosensitive silver halide emulsions said photosensitive layer being in water permeable relationship with said image receiving layer, applying an aqueous alkaline solution to the imaging element comprising at least 0.05 mole/l of ascorbic acid as the main developer, at least 0.010 mole/l of an auxiliary developer of the class of the 1-phenyl-3-pyrazolidones and an aminoalcohol in an amount from 0.1 ml to 10 ml as silver halide solvent to form a silver image in said image receiving layer, treating the imaging element to remove the layer(s) on top of the image receiving layer, thereby exposing the imaged surface of the support by uncovering said silver image formed in said image receiving layer, characterized in that said aqueous alkaline solution contains sodium ions but no potassium ions or sodium and potassium ions in which case the molar ratio of sodium ions to potassium ions in said aqueous alkaline solution is at least 3:1.

DETAILED DESCRIPTION OF THE INVENTION

In order to provide a method for making a lithographic printing plate according to the DTR-process with an improved sensitometry, usually research is directed to improve the imaging element. Now it has been found by us that said improved sensitometry can be obtained by optimizing the developing solution.

According to the invention the molar ratio of sodium ions to potassium ions in said aqueous alkaline solution is preferably at least 9:1, more preferably 95:5 and most preferably 98:2. The upper limit is an aqueous alkaline solution containing sodium ions but completely free of potassium ions.

The imaging element for use in the present invention for making an offset printing plate comprises in the order given on a hydrophilic surface of a support (i) a layer of physical development nuclei as image receiving layer and (ii) a photosensitive layer comprising one or more silver halide emulsions being in water permeable relationship with said image receiving layer.

Layers being in waterpermeable contact with each other are layers that are contiguous to each other or only separated from each other by (a) waterpermeable layer(s). The nature of a waterpermeable layer is such that it does not substantially inhibit or restrain the diffusion of water or of compounds contained in an aqueous solution e.g. developing agents or the complexed silver.

The imaging element is preferably prepared by coating the different layers on a hydrophilic surface of a support. Alternatively the different layers may be laminated to said image receiving layer from a temporary base holding the layers in reverse order as disclosed in U.S. Pat. No. 5,068,165.

Said hydrophilic surface of a support can be a hardened hydrophilic layer, containing a hydrophilic binder and a hardening agent coated on a flexible support.

Such hydrophilic binders are disclosed in e.g. EP-A 450,199, which therefor is incorporated herein by reference. Preferred hardened hydrophilic layers comprise partially modified dextrans or pullulan hardened with an aldehyde as disclosed in e.g. EP-A 514,990 which therefor is incorporated herein by reference. More preferred hydrophilic layers are layers of polyvinyl alcohol hardened with a tetraalkyl orthosilicate and preferably containing $SiO_2$ and/or $TiO_2$ wherein the weight ratio between said polyvinylalcohol and said tetraalkyl orthosilicate is between 0.5 and 5 as disclosed in e.g. GB-P 1,419,512, FR-P 2,300,354, U.S. Pat. No. 3,971,660, U.S. Pat. No. 4,284,705, EP-A 405,016 and EP-A 450,199 which therefor are incorporated herein by reference.

Flexible supports may be opaque or transparent, e.g. a paper support or resin support. When a paper support is used preference is given to one coated at one or both sides with an Alpha-olefin polymer. It is also possible to use an organic resin support e.g. poly(ethylene terephthalate) film or poly-Alpha-olefin films. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports e.g. aluminum may also be used.

Said hydrophilic surface of a support may be a hydrophilic metallic support e.g. an aluminum foil.

The aluminum support of the imaging element for use in accordance with the present invention can be made of pure aluminum or of an aluminum alloy, the aluminum content of which is at least 95%. The thickness of the support usually ranges from about 0.13 to about 0.50 mm.

The preparation of aluminum or aluminum alloy foils for lithographic offset printing comprises the following steps graining, anodizing, and optionally sealing of the foil.

Graining and anodization of the foil are necessary to obtain a lithographic printing plate that allows the production of high-quality prints in accordance with the present invention. Sealing is not necessary but may still improve the printing results. Preferably the aluminum foil has a roughness with a CLA value between 0.2 and 1.5 µm, an anodization layer with a thickness between 0.4 and 2.0 µm and is sealed with an aqueous bicarbonate solution.

According to the present invention the roughening of the aluminum foil can be performed according to the methods well known in the prior art. The surface of the aluminum substrate can be roughened either by mechanical, chemical or electrochemical graining or by a combination of these to obtain a satisfactory adhesiveness of a silver halide emulsion layer to the aluminum support and to provide a good water retention property to the areas that will form the non-printing areas on the plate surface.

The electrochemical graining process is preferred because it can form a uniform surface roughness having a large average surface area with a very fine and even grain which is commonly desired when used for lithographic printing plates.

Electrochemical graining can be conducted in a hydrochloric and/or nitric acid containing electrolyte solution using an alternating or direct current. Other aqueous solutions that can be used in the electrochemical graining are e.g. acids like $H_2SO_4$, $H_3PO_4$, that if desired, contain additionally one or more corrosion inhibitors such as $Al(NO_3)_3$, $AlCl_3$, boric acid, chromic acid, sulphates, chlorides, nitrates, monoamines, diamines, aldehydes, phosphates, $H_2O_2$, etc. . . .

Electrochemical graining in connection with the present invention can be performed using single-phase and three-phase alternating current. The voltage applied to the aluminum plate is preferably 10–35 V. A current density of 3–150 Amp/dm$^2$ is employed for 5–240 seconds. The temperature of the electrolytic graining solution may vary from 5°–50° C. Electrochemical graining is carried out preferably with an alternating current from 10 Hz to 300 Hz.

The roughening is preferably preceded by a degreasing treatment mainly for removing greasy substances from the surface of the aluminum foil.

Therefore the aluminum foil may be subjected to a degreasing treatment with a surfactant and/or an aqueous alkaline solution.

Preferably roughening is followed by a chemical etching step using an aqueous solution containing an acid. The chemical etching is preferably carried out at a temperature of at least 30° C. more preferably at least 40° C. and most preferably at least 50° C.

Suitable acids for use in the aqueous etch solution are preferably inorganic acids and most preferably strong acids. The total amount of acid in the aqueous etch solution is preferably at least 150 g/l. The duration of chemical etching is preferably between 3 s and 5 min.

After roughening and optional chemical etching the aluminum foil is anodized which may be carried out as follows.

An electric current is passed through the grained aluminum foil immersed as an anode in a solution containing sulphuric acid, phosphoric acid, oxalic acid, chromic acid or organic acids such as sulphamic, benzosulphonic acid, etc. or mixtures thereof. An electrolyte concentration from 1 to 70% by weight can be used within a temperature range from 0°–70° C. The anodic current density may vary from 1–50 A/dm$^2$ and a voltage within the range 1–100 V to obtain an anodized film weight of 1–8 g/m$^2$ $Al_2O_3.H_2O$. The anodized aluminum foil may subsequently be rinsed with demineralised water within a temperature range of 10°–80° C.

After the anodizing step sealing may be applied to the anodic surface. Sealing of the pores of the aluminum oxide layer formed by anodization is a technique known to those skilled in the art of aluminum anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminum". Different types of sealing of the porous anodized aluminum surface exist.

Preferably, said sealing is performed by treating a grained and anodized aluminum support with an aqueous solution containing a bicarbonate as disclosed in EP-A 567178, which therefor is incorporated herein by reference.

Preferably each of the above described steps is separated by a rinsing step to avoid contamination of the liquid used in a particular step with that of the preceding step.

To promote the image sharpness and, as a consequence thereof, the sharpness of the final printed copy, the anodization layer may be coloured in the mass with an antihalation dye or pigment e.g. as described in JA-Pu-58-14,797.

Subsequent to the preparation of the hydrophilic layer of a support as described above, said hydrophilic layer may be immediately coated with a solution containing the physical development nuclei or may be coated with said solution at a later stage.

The image receiving layer containing physical development nuclei may be free of hydrophilic binder but preferably comprises amounts upto e. g. 80% by weight of the total weight of said layer of a hydrophilic colloid e.g. polyvinyl alcohol to improve the hydrophilicity of the surface.

Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are salts such as e.g. selenides, polyselenides, polysulphides, mercaptans, and tin (II) halides. Heavy metals, preferably silver, gold, platinum, palladium, and mercury can be used in colloidal form.

The photosensitive layer used according to the present invention may be any layer comprising a hydrophilic colloid binder and at least one silver halide emulsion, at least one of the silver halide emulsions being photosensitive.

The photographic silver halide emulsion(s) used in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

For use according to the present invention the silver halide emulsion or emulsions preferably consist principally of silver chloride while a fraction of silver bromide may be present ranging from 0.1 mole % to 40 mole % and a fraction of silver iodide ranging from 0.01 mole % to 2 mole %. More preferably a silver halide emulsion containing at least 90 mole% of silver chloride is used. Most preferably a silver halide emulsion containing at least 99 mole% of silver chloride and free of silver bromide is used.

The sum of the silver halide in said one or more silver halide emulsions (expressed as $AgNO_3$) is preferably not more than 2 g $AgNO_3/m^2$, more preferably not more than 1.75 g $AgNO_3/m^2$.

The minimum amount of the the sum of the silver halide in said one or more silver halide emulsions (expressed as $AgNO_3$) is not so critical but is preferably at least 0.9 g $AgNO_3m^2$, more preferably at least 1.1 g $AgNO_3/m^2$.

The average size of the silver halide grains may range from 0.10 to 0.70 μm , preferably from 0.25 to 0.45 μm.

Preferably during the precipitation stage iridium and/or rhodium containing compounds or a mixture of both are added. The concentration of these added compounds ranges from $10^{-8}$ to $10^{-3}$ mole per mole of $AgNO_3$, preferably between $10^{-7}$ and $10^{-3}$ mole per mole of $AgNO_3$.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R.KOSLOWSKY. Z. Wiss. Photogr. Photophys. Photochem. 46, 65–72 (1951).

The silver halide emulsions of the DTR-element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemibxonol dyes. Particularly valuable dyes are those belonging to the cyanine dyes, merocyanine dyes, complex merocyanine dyes.

In the case of a conventional light source, e.g. tungsten light, a green sensitizing dye is needed. In case of exposure by an argon ion laser a blue sensitizing dye is incorporated. In case of exposure by a red light emitting source, e.g. a LED or a HeNe laser a red sensitizing dye is used. In case of exposure by a semiconductor laser special spectral sensitizing dyes suited for the near infra-red are required. Suitable infra-red sensitizing dyes are disclosed in i.a. U.S. Pat. Nos. 2,095,854, 2,095,856, 2,955,939, 3,482,978, 3,552,974, 3,573,921, 3,582,344, 3,623,881 and 3,695,888.

A preferred blue sensitizing dye, green sensitizing dye, red sensitizing dye and infra-red sensitizing dye in connection with the present invention are described in EP-A 554,585.

To enhance the sensitivity in the red or near infra-red region use can be made of so-called supersensitizers in combination with red or infra-red sensitizing dyes. Suitable supersensitizers are described in Research Disclosure Vol 289, May 1988, item 28952. The spectral sensitizers can be added to the photographic emulsions in the form of an aqueous solution, a solution in an organic solvent or in the form of a dispersion.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds.

The silver halide emulsion layers usually contain gelatin as hydrophilic colloid binder. Mixtures of different gelatins with different viscosities can be used to adjust the rheological properties of the layer. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.. Preferably the silver halide emulsion layer contains at least one gelatin species whereof a 10% by weight aqueous solution at 36 °C. and pH 6 has a viscosity lower than 20 mPas at a shearing rate of 1000 s$^{-1}$ combined with a gelatin of a higher viscosity. The weight ratio of said low viscosity gelatin versus the gelatin of a higher viscosity is preferably >0.5.

Preferably the gelatin layer(s) is(are) substantially unhardened. Substantially unhardened means that when such gelatin layer is coated on a subbed polyethylene terephtalate film base at a dry thickness of 1.2 g/m$^2$, dried for 3 days at 57° C. °and 35% R.H. and dipped in water of 30° C., said gelatin layer is dissolved for more than 95% by weight within 5 minutes.

The silver halide emulsions may contain pH controlling ingredients. Preferably at least one gelatin containing layer is coated at a pH value not below the iso-electric point of the gelatin to avoid interactions between said gelatin containing coated layer and the hereafter mentioned intermediate layer. More preferably the gelatin layer contiguous to said intermediate layer is coated at a pH value not below the iso-electric point of the gelatin. Most preferably all the gelatin containing layers are coated at a pH value not below the iso-electric point of their gelatin. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787 and DE-P 2,453,217.

More details about the composition, preparation and coating of silver halide emulsions suitable for use in accordance with the present invention can be found in e.g. Product Licensing Index, Vol. 92, December 1971, publication 9232, p. 107–109.

According to the invention said imaging element preferably comprises on top of the photosensitive layer and in water permeable relationship therewith an uppermost composition (antistress composition) comprising unhardened gelatin in an amount ranging from 0.60 to 1.75 g/m$^2$, more preferably in an amount ranging from 0.80 to 1.25 g/m$^2$.

Preferably at least 50%, more preferably at least 75%, most preferably at least 90% by weight of said unhardened gelatin belongs to one or more gelatin species whereof a 10% by weight aqueous solution at 40° C. and pH 6 has a viscosity lower than 20 mPas, more preferably lower than 15 mPas at a shearing rate of 1000 s$^{-1}$.

The antistress composition can comprise more than one species of unhardened gelatin whereof a 10% by weight aqueous solution at 40° C. and pH 6 has a viscosity lower than 20 mPas at a shearing rate of 1000 s$^{-1}$, but it is preferred for practical reasons that said composition comprises only one such gelatin. When a mixture of unhardened gelatins is used, a 10% by weight aqueous solution of said mixture of unhardened gelatins has at 40° C. and pH 6 preferably a viscosity lower than 20 mPas at a shearing rate of 1000 s$^{-1}$.

The antistress composition may contain small particles e.g. matting agents with a mean diameter between 0.2 and 10 μm in order to improve the diffusion of processing solutions through said antistress composition.

The antistress composition can comprise more than one layer, but for practical reasons it is preferred that said composition consists of one layer.

Preferably, the imaging element also comprises an intermediate layer between the image receiving layer on the hydrophilic surface of a support and the photosensitive layer(packet) to facilate the removal of said layer(packet) thereby uncovering the silver image formed in the image receiving layer by processing the imaging element.

In one embodiment, the intermediate layer is a water-swellable intermediate layer coated at a ratio of 0.01 to 2.0 g/m2 and comprising at least one non-proteinic hydrophilic film-forming polymer e.g. polyvinyl alcohol and optionally comprising an antihalation dye or pigment as disclosed in EP-A-410500.

In another embodiment, the intermediate layer is a layer comprising hydrophobic polymer beads having an average diameter not lower than 0.2 μm and having been prepared by polymerization of at least one ethylenically unsaturated monomer. Preferably, said intermediate layer in dry condition comprises said hydrophobic polymer beads in an amount of up to 80% of its total weight. Further details are disclosed in EP-A-483415.

In still another embodiment, the intermediate layer is a layer comprising particles of a water insoluble inorganic compound having a number average size not lower than 0.1 μm. Preferably, said intermediate layer comprises said water insoluble inorganic compound in an amount of at least 0.1 g/im$^2$. Further details are disclosed in EP-A-94203779.7

In still another embodiment, the intermediate layer is a layer comprising particles of an alkali insoluble non-polymeric organic compound having a melting point of at least 50° C., said particles having a number average size between 0.1 μm and 10 μm. Preferably, said intermediate layer comprises said alkali insoluble non-polymeric organic compound in an amount of at least 0.1 g/m$^2$. Further details are disclosed in EP-A-95201713.5

In still another embodiment, the intermediate layer is a layer comprising particles of an alkali insoluble polymeric organic compound obtainable by polycondensation, said particles having a number average size between 0.02 μm and 10 μm. Preferably, said intermediate layer comprises said alkali insoluble polymeric organic compound obtainable by polycondensation in an amount of at least 0.1 g/m$^2$. Further details are disclosed in EP-A-95203052.6.

A supplemental intermediate layer, which may be present between said silver halide emulsion containing layer and said intermediate layer may incorporate one or more ingredients such as i.a. antihalation dyes or pigment, developing agents, silver halide solvents, base precursors, and anticorrosion substances.

When the imaging element is prepared by laminating a layer packet comprising a photosensitive layer onto the image receiving layer the intermediate layer(s) are provided on the photosensitive layer(s), the intermediate layer being the upper layer.

According to the present invention the imaging element can be information-wise exposed in an apparatus according to its particular application. A wide choice of cameras for exposing the photosensitive silver halide emulsion exists on the market. Horizontal, vertical and darkroom type cameras and contact-exposure apparatus are available to suit any particular class of reprographic work. The imaging element in accordance with the present invention can also be exposed with the aid of i.a. laser recorders and cathode rays tubes.

The development and diffusion transfer of the information-wise exposed imaging element in order to form a silver image in said photosensitive layer and to allow unreduced silver halide or complexes formed thereof to diffuse image-wise from the photosensitive layer to said image receiving layer to produce therein a silver image, are effected with the aid of an aqueous alkaline solution comprising at least 0.05 mole/l of ascorbic acid as the main developer, at least 0.010 mole/l of an auxiliary developer of the class of the 1-phenyl-3-pyrazolidones and an aminoalcohol in an amount from 0.1 ml to 10 ml as silver halide solvent.

The developing agent(s) and/or the silver halide solvent(s) can be partially incorporated in the imaging element itself e.g. in at least one silver halide emulsion layer and/or in a water-swellable layer and/or in a supplemental hydrophilic colloid layer in water-permeable relationship with the silver halide emulsion layer(s). However preferably the total amount of all the developing agents and silver halide solvent (s) are present in the aqueous alkaline solution.

According to the invention said developing solution comprises as the main developer ascorbic acid in a concentration of at least 0.05 mole/l, preferably in a concentration of at least 0.10 mole/l, more preferably in a concentration of at least 0.15 mole/l.

According to the invention said developing solution comprises at least 0.010 mole/l, preferably at least 0.020 mole/l, most preferably at least 0.030 mole/l of an auxiliary developer of the class of the 1-phenyl-3-pyrazolidones (also called phenidones). The upper limit is not so important but is preferably not higher than 0.10 mole/l.

Said auxiliary developer of the class of the 1-phenyl-3-pyrazolidones are e.g. 1-phenyl-3-pyrazolidone, 1-phenyl-4-monomethyl-3-pyrazolidone, 1-phenyl-4,4-dimethyl-3-pyrazolidone and 1-phenyl-3-pyrazolidones of which the aqueous solubility is increased by a hydrophilic substituent such as e.g. hydroxy, amino, carboxylic acid group, sulphonic acid group etc.. Examples of 1-phenyl-3-pyrazolidones subsituted with one or more hydrophilic groups are e.g. 1-phenyl-4-methyl-4-hydroxymethyl-3-pyrazolidone, 1-phenyl-4,4',-dihydroxymethyl-3-pyrazolidone, 1-(4-carboxyphenyl)-4,4-dimethyl-3-pyrazolidone etc..

Preferably said alkaline developing solution contains a mono- or polysaccharide such as cyclodextrine as a preservative for ascorbic acid.

Alkanolamines that are suitable for use in connection with the present invention may be of the tertiary, secundary or primary type. Examples of alkanolamines that may be used in connection with the present invention correspond to the following formula:

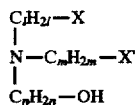

wherein X and X' independently represent hydrogen, a hydroxyl group or an amino group, 1 and m represent 0 or integers of 1 or more and n represents an integer of 1 or more. Preferably used alkanolamines are e.g. diethanolamine, N-methylethanolamine, triethanolamine, N-ethyldiethanolamine, diisopropanolamine, N,N-dimethylethanolamine, N,N-ethyl-2,2'-iminodiethanol etc. or mixtures thereof.

More preferred aminoalcohols according to the invention are primary aminoalcohols such as ethanolamine, 4-aminobutanol, 3-aminopropanol, most preferred 2-aminoethyl-aminoethanol.

Said aminoalcohols are preferably used in an amount between 0.3 and 5 ml/l aqueous alkaline solution, more preferably in an amount between 0.5and 3 ml/l aqueous alkaline solution.

Optionally a further silver halide solvent in the aqueous alkaline solution is used in an amount between 0.05% by weight and 5% by weight and more preferably between 0.5% by weight and 2% by weight. Further silver halide solvents that can be used in connection with the present invention are e.g. amines, 2-mercaptobenzoic acid, cyclic imide compounds such as e.g. uracil, 5,5-dialkylhydantoins, alkyl sulphones, thiocyanates and oxazolidones.

Still other optional further silver halide solvents for use in connection with the present invention are thioethers. Preferably used thioethers correspond to the following general formula:

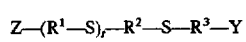

wherein Z and Y each independently represents hydrogen, an alkyl group, an amino group, an ammonium group, a hydroxyl, a sulpho group, a carboxyl, an aminocarbonyl or an aminosulphonyl, $R^1$, $R^2$ and $R^3$ each independently represents an alkylene that may be substituted and optionally contain an oxygen bridge and t represents an integer from 0 to 10. Examples of thioether compounds corresponding to the above formula are disclosed in e.g. US-P-4.960.683 and EP-A 554.585.

Still further suitable silver halide solvents are 1,2,4-triazolium-3-thiolates, preferably 1,2,4-triazolium-3-thiolates substituted with at least one substituent selected from the group consisting of a $C_1$–$C_8$ alkyl group that contains at least 3 fluorine atoms, a $C_4$–$C_1$o hydrocarbon group and a 4-amino group substituted with a $C_1$–$C_8$ alkyl group that contains at least 3 fluorine atoms and/or a $C_4$–$C_1$hydrocarbon group.

Combinations of different silver halide solvents can be used and it is also possible to incorporate at least one further silver halide solvent into a suitable layer of the imaging element and to add at least one other further silver halide solvent to the developing solution.

The aqueous alkaline solution in accordance with the present invention may further comprise sulphite e.g. sodium sulphite in an amount ranging from 40 g to 180 g per liter, preferably from 60 to 160 g per liter in combination with another silver halide solvent.

The quantitative ranges given for the developing agents, silver halide solvents, and sulphite apply to the amount of these compounds present as solutes in the aqueous alkaline solution during the DTR-processing, whether these compounds make part of the aqueous alkaline solution or were dissolved from the layers containing them upon application thereto of the aqueous alkaline solution.

The aqueous alkaline solution suitable for use according to the present invention preferably comprises aluminum ions in an amount of at least 0.3 g/l, more preferably in an amount of at least 0.6 g/l in order to prevent sticking of the emulsion layer to the transporting rollers when the emulsion is swollen with the aqueous alkaline solution.

The alkaline processing liquid preferably has a pH between 9 and 14 and more preferably between 10 and 13, but depends on the type of silver halide emulsion material to be developed, intended development time, and processing temperature.

The processing conditions such as temperature and time may vary within broad ranges provided the mechanical strength of the materials to be processed is not adversely influenced and no decomposition takes place.

The pH of the alkaline processing liquid may be established by an organic or inorganic alkaline substance or a combination thereof. Suitable inorganic alkaline substances are e.g. hydroxides of sodium and potassium, alkali metal salts of phosphoric acid and/or silicic acid e.g. trisodium phosphate, orthosilicates, metasilicates, hydrodisilicates of sodium or potassium, and sodium carbonate etc.. Suitable organic alkaline substances are e.g. alkanolamines. In the latter case the alkanolamines will provide or help providing the pH and serve as a silver halide complexing agent.

The aqueous alkaline solution may further comprise hydrophobizing agents for improving the hydrophobicity of the silver image obtained in the image receiving layer. Generally these compounds contain a mercapto group or thiolate group and one or more hydrophobic substituents. Particularly preferred hydrophobizing agents are mercapto-1,3,4-thiadiazoles as described in DE-A 1,228,927 and in U.S. Pat. No. 4,563,410, 2-mercapto-5-alkyl-oxa-3,4-diazoles, 3-mercapto-5-alkyl-1,2,4-triazoles and long chain (at least 5 carbon atoms) alkyl substituted mercaptotetrazoles. The hydrophobizing agents can be used alone or in combination with each other.

These hydrophobizing compounds can be added to the aqueous alkaline solution in an amount of preferably 0.1 to 3 g per litre and preferably in admixture with 1-phenyl-5-mercaptotetrazole, the latter compound may be used in amounts of e.g. 50 mg to 1.2 g per litre of solution, which may contain a minor amount of ethanol to improve the dissolution of said compounds.

The aqueous alkaline solution may comprise other ingredients such as e.g. oxidation preservatives, calcium-sequestering compounds, anti-sludge agents, and hardeners including latent hardeners.

Regeneration of the aqueous alkaline solution according to known methods is, of course, possible, whether the solution incorporates developing agent(s) or not.

The development may be stopped—though this is often not necessary—with a so-called stabilization liquid, which actually is an acidic stop-bath having a pH preferably in the range from 5 to 7.

Bufferred stop bath compositions comprising a mixture of sodium dihydrogen orthophosphate and disodium hydrogen orthophosphate and having a pH in said range are preferred.

The development and diffusion transfer can be initiated in different ways e.g. by rubbing with a roller, by wiping with an absorbent means e.g. with a plug of cotton or sponge, or by dipping the material to be treated in the liquid composition. Preferably, they proceed in an automatically operated apparatus. They are normally carried out at a temperature in the range of 18° C. to 30° C. and in a time from 5 s to 5 min.

After formation of the silver image on the hydrophilic surface of a support an excess of aqueous alkaline solution still present on the base may be eliminated, preferably by guiding the foil through a pair of squeezing rollers.

The silver image thus obtained in the layer of physical development nuclei is subsequently uncovered by treating the imaging element to remove all the layers above the layer containing physical development nuclei, thereby exposing the imaged surface of the hydrophilic support.

According to a particularly preferred embodiment of the present invention the silver image in the layer of physical development nuclei is uncovered by washing off all the layers above the layer containing physical development nuclei with rinsing water.

The temperature of the rinsing water may be varied widely but is preferably between 30 °C. and 50 °C., more preferably between 35° C. and 45° C.

The imaged surface of the hydrophilic surface of a support can be subjected to a chemical treatment that increases the hydrophilicity of the non-silver image parts and the oleophilicity of the silver image.

This chemical after-treatment is preferably carried out with a lithographic composition often called finisher comprising at least one compound enhancing the ink-receptivity and/or lacquer-receptivity of the silver image and at least one compound that improves the ink-repelling characteristics of the hydrophilic surface.

Suitable ingredients for the finisher are e.g. organic compounds containing a mercapto group such as the hydrophobizing compounds referred to hereinbefore for the alkaline solution. Preferred compounds correspond to one of the following formulas:

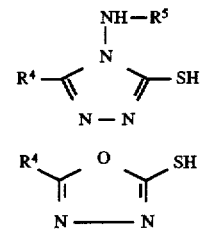

wherein $R^5$ represents hydrogen or an acyl group, $R^4$ represents alkyl, aryl or aralkyl. Most preferably used compounds are compounds according to one of the above formulas wherein $R^4$ represents an alkyl containing 3 to 16 C-atoms. Said (a) hydrophobizing agent(s) is(are) comprised in the finisher preferably in a total concentration between 0.1 g/l and 10 g/l, more preferably in a total concentration between 0.3 g/l and 3 g/l.

Additives improving the oleophilic ink-repellency of the hydrophilic surface areas are e.g. carbohydrates such as acid polysaccharides like gum arabic, carboxymethylcellulose, sodium alginate, propylene glycol ester of alginic acid, hydroxyethyl starch, dextrin, hydroxyethylcellulose, polyvinyl pyrrolidone, polystyrene sulphonic acid, polyglycols being the reaction products of ethyleneoxide and/or propyleneoxide with water or an alcohol and polyvinyl alcohol. Optionally, hygroscopic substances e.g. sorbitol, glycerol, tri(hydroxyethyl)ester of glycerol, and turkish red oil may be added.

Furthermore (a) surface-active compound(s) is (are) preferably also added to the finisher. The concentration thereof may vary within broad ranges provided the finisher shows no excessive degree of foaming when plates are finished. Preferred surface-active compound are anionic or non-ionic surface-active compound.

A suitable finisher as disclosed in U.S. Pat. no. 4,563,410 is a composition comprising a solution of a mercaptotriazole in a solution of polyethylene oxide with a molecular weight of 4,000. Further suitable finishers have been described in i.a. U.S. Pat. No. 4,062,682 and EP 681219.

At the time the treatment with the finisher is started the surface carrying the silver pattern may be in dry or wet state. In general, the treatment with the finisher does not take long, usually not longer than about 30 seconds and it may be carried out immediately after the processing and uncovering steps, preferably at a temperature of the finisher in the range from 30° C. to 60° C.

The finisher can be applied in different ways such as by rubbing with a roller, by wiping with an absorbent means e.g. with a plug of cotton or sponge, or by dipping the material to be treated in the finisher. The image-hydrophobizing step of the printing plate may also proceed automatically by conducting the printing plate through a device having a narrow channel filled with the finisher and conveying the printing plate at the end of the channel between two squeezing rollers removing the excess of liquid.

As soon as the hydrophilic surface of a support carrying the silver image has been treated with the finisher, it is ready to be used as a printing plate.

EXAMPLE

A 0.30 mm thick aluminum foil (AA 1050) was degreased by immersing the foil in an aqueous solution containing 10 % phosphoric acid and subsequently etched in an aqueous solution containing 2 g/l of sodium hydroxide. The foil was then electrochemically grained using an alternating current in an aqueous solution containing 4 g/l of hydrochloric acid and 4 g/l of hydroboric acid at a temperature of 35° C. to form a surface topography with an average center-line roughness Ra of 0.6 μm. The aluminum plate was then desmutted with an aqueous solution containing 30% of sulfuric acid at 60° C. for 120 seconds. The foil was subsequently subjected to anodic oxidation in a 20% sulfuric acid aqueous solution to form an anodic oxidation film of 3.0 g/m of $Al_2O_3.H_2O$, treated with an aqueous solution containing 20 g/l of $NaHCO_3$ at 45° C. for 30 sec and then rinsed with demineralised water and dried.

The imaging element was obtained by coating the grained, anodized and sealed aluminum support with a silver-receptive stratum containing 1.1 mg/m² PdS as physical development nuclei.

An intermediate layer was then provided on the dry silver-receptive stratum from an aqueous composition in such a way that the resulting dried layer had a weight of 0.5 g of polymethyl methacrylate beads per m², said composition comprising:

| | |
|---|---|
| a 20% dispersion of polymethyl methacrylate beads in a mixture of equal volumes of water and ethanol having an average diameter of 1.0 μm | 50 ml |
| Helioechtpapierrot BL (trade mark for a dye sold by BAYER AG, D-5090 Leverkusen, West-Germany) | 2.5 g |
| saponine | 2.5 g |
| sodium oleylmethyltauride | 1.25 g |
| demineralized water | 300 ml |
| (pH-value : 5.6) | |

Finally a substantially unhardened photosensitive negative-working cadmium-free gelatin silver chloroiodide emulsion layer (99.8/0.2 mol%) containing 1 mmole/mole AgX of 4-hydroxy-6-methyl-1,3,3a, 7-tetraazaindene was coated on the intermediate layer, the silver halide being provided in an amount corresponding to 1.80 g of silver nitrate per m² and the gelatin content of the emulsion layer being 1.14 g/m², consisting of 0.50 g/m² of a gelatin with a viscosity of 21 mPa.s and the remainder of a gelatin with a viscosity of 14 mPa.s Three samples of the imaging element were exposed through a contact screen in a process-camera and respectively immersed for 10 s at 24° C. in one of the freshly made developing solutions 1 to 3 having the following ingredients:

| Developer 1 | |
|---|---|
| carboxymethylcellulose | 4 g |
| sodium hydroxide | 22.5 g |
| anhydrous sodium sulphite | 120 g |
| ascorbic acid | 35.2 g |
| 1-phenyl-3-pyrazolidinone | 6 g |
| aminoethyl-aminoethanol | 1 ml |
| ethylene diamine tetraacetate acid tetrasodium salt | 2 g |
| aluminum sulphate, 18 aq | 8.4 g |
| demineralized water to make | 1000 ml |
| pH (24° C.) = 13 | |

Developer 2 is identical with developer 1 except that half of the amount of sodium hydroxide was replaced by 15.75 g of potassium hydroxyde and that half the amount of sodium sulphite was replaced by 72 gram of potassium sulphite. Developer 3 is identical with developer 1 except that the total amount of sodium hydroxide was replaced by 31.5 g of potassium hydroxide and that the total amount of sodium sulphite was replaced by 144 g of potassium sulphite.

The initiated diffusion transfer was allowed to continue for 30 s to form a silver image in the image receiving layer.

To remove the developed silver halide emulsion layer and the intermediate layer from the aluminum foil the developed monosheet DTR material was rinsed for 6 s with a water jet at 40° C. The results are given in table 1.

TABLE 1

| Developer | Dmin[a] | Grad 1[b] | Grad 2[c] | Grad 3[d] |
|---|---|---|---|---|
| 1 | 0.278 | 2.65 | 1.14 | 3.81 |
| 2 | 0.391 | 2.23 | 1.00 | 1.74 |
| 3 | 0.568 | 1.23 | 0.89 | 0.95 |

[a] Dmin: minimum density
[b] Grad 1: The gradient of the sensitometric curve of the printing plate between the points 25% above the minimum density and 25% below the maximum density.
[c] Grad 2: The gradient of the sensitometric curve of the printing plate between Dmin + 0.10 and Dmin + 0.25
[d] Grad 3: The gradient of the sensitometric curve of the printing plate between 25% and 10% below the maximum density.

Evaluation:

From these results it is seen that by using a developer comprising sodium ions but no potassium ions (developer 1) a printing plate is obtained with a lower Dmin and higher gradients than by using a developer having a molar ratio of sodium ions to potassium ions of 1 (developer 2) or than by using a developer comprising potassium ions but no sodium ions (developer 3).

We claim:

1. A method for making an offset printing plate according to the silver salt diffusion transfer process comprising the steps of:

image-wise exposing an imaging element comprising in the order given on a hydrophilic surface of a support (i) an image receiving layer containing physical development nuclei and (ii) a photosensitive layer comprising one or more photosensitive silver halide emulsions said photosensitive layer being in water permeable relationship with said image receiving layer, applying an aqueous alkaline solution to the imaging element comprising at least 0.05 mole/l of ascorbic acid as the main developer, at least 0.010 mole/l of an auxiliary developer of the class of the 1-phenyl-3-pyrazolidones and an aminoalcohol in an amount from 0.1 ml to 10 ml as silver halide solvent to form a silver image in said image receiving layer, treating the imaging element to remove the layer(s) on top of the image receiving layer, thereby exposing the imaged surface of the support by uncovering said silver image formed in said image receiving layer, characterized in that said aqueous alkaline solution contains sodium ions but no potassium ions or sodium and potassium ions in which case the molar ratio of sodium ions to potassium ions in said aqueous alkaline solution is at least 3:1.

2. A method according to claim 1 wherein the molar ratio of sodium ions to potassium ions in said aqueous alkaline solution is at least 9:1.

3. A method according to claim 1 wherein the molar ratio of sodium ions to potassium ions in said aqueous alkaline solution is at least 95:5.

4. A method according to claim 1 wherein the molar ratio of sodium ions to potassium ions in said aqueous alkaline solution is at least 98:2.

5. A method according to claim 1 wherein said hydrophilic surface of a support is an aluminum foil.

6. A method according to claim 1 wherein said silver halide emulsion comprises at least 90 mole % of silver chloride.

7. A method according to claim 1 wherein the sum of the silver halide in said one or more silver halide emulsions (expressed as $AgNO_3$) is not more than 2 g $AgNO_3$/m.

8. A method according to claim 1 wherein said developing solution comprises as the main developer ascorbic acid in a concentration of at least 0.10 mole/l.

9. A method according to claim 1 wherein said developing solution comprises at least 0.020 mole/l of an auxiliary developer of the class of the 1-phenyl-3-pyrazolidones.

10. A method according to claim 1 wherein said aminoalcohol is used in an amount between 0.3 and 5 ml/l aqueous alkaline solution.

* * * * *

UNITED STATES PATENT AND TRADEMARK OFFICE
CERTIFICATE OF CORRECTION

PATENT NO. : 5,753,408

DATED : May 19, 1998

INVENTOR(S) : Ludo Van Rompuy et al

It is certified that error appears in the above-indentified patent and that said Letters Patent is hereby corrected as shown below:

Column 1, lines 7 and 8, "application 60/014,899" should read -- application 60/014,877 --;

Column 4, line 27, "AlCl3," should read -- $AlCl_3$, --;

Column 6, line 14, "between $10^{-7}$ and $10^{-3}$ mole" should read -- between $10^{-7}$ and $10^{-5}$ mole --;

Column 6, line 37, "dyes and hemibxonol" should read -- dyes and hemioxonol --;

Column 8, lines 36 and 37, "0.1 g/im$^2$." should read -- 0.1 g/m$^2$. --;

Column 10, line 41, "a $C_4$-$C_1$o hydrocarbon" should read -- a $C_4$-$C_{10}$ hydrocarbon --;

Column 10, line 44, "$C_4$-$C_1$ hydrocarbon group." should read -- $C_4$-$C_{10}$ hydrocarbon group. --;

Column 13, lines 32 and 33, "film of 3.0 g/m" should read -- film of 3.0 g/m$^2$ --;

UNITED STATES PATENT AND TRADEMARK OFFICE
CERTIFICATE OF CORRECTION

PATENT NO. : 5,753,408
DATED : May 19, 1998
INVENTOR(S) : Ludo Van Rompuy et al

PAGE 2 of 2

It is certified that error appears in the above-indentified patent and that said Letters Patent is hereby corrected as shown below:

Claim 7, column 16, line 10, "not more than 2 g $AgNO_3/m$." should read -- not more than 2 g $AgNO_3/m^2$. --.

Signed and Sealed this

Twenty-ninth Day of September, 1998

Attest:

BRUCE LEHMAN

*Attesting Officer*     *Commissioner of Patents and Trademarks*